US011744082B2

(12) United States Patent
Cho et al.

(10) Patent No.: US 11,744,082 B2
(45) Date of Patent: Aug. 29, 2023

(54) MEMORY SEMICONDUCTOR DEVICES COMPRISING AN ANTI-FERROELECTRIC MATERIAL

(71) Applicant: Samsung Electronics Co., Ltd., Suwon-si (KR)

(72) Inventors: Byungjin Cho, Daejeon (KR); Sungwon Shin, Hwaseong-si (KR); Euijoong Shin, Daejeon (KR)

(73) Assignees: Samsung Electronics Co., Ltd., Suwon-si (KR); Korea Advanced Institute of Science and Technology, Daejeon (KR)

( * ) Notice: Subject to any disclaimer, the term of this patent is extended or adjusted under 35 U.S.C. 154(b) by 80 days.

(21) Appl. No.: 17/316,777

(22) Filed: May 11, 2021

(65) Prior Publication Data

US 2021/0399019 A1   Dec. 23, 2021

(30) Foreign Application Priority Data

Jun. 23, 2020   (KR) .................. 10-2020-0076621

(51) Int. Cl.
| | |
|---|---|
| H10B 51/20 | (2023.01) |
| H01L 29/51 | (2006.01) |
| H10B 51/30 | (2023.01) |
| H10B 51/40 | (2023.01) |
| H10B 43/40 | (2023.01) |
| H10B 43/20 | (2023.01) |
| H10B 43/30 | (2023.01) |

(52) U.S. Cl.
CPC ............ *H10B 51/20* (2023.02); *H01L 29/516* (2013.01); *H10B 43/20* (2023.02); *H10B 43/30* (2023.02);

(Continued)

(58) Field of Classification Search
CPC .......... H01L 27/11578; H01L 27/1158; H01L 27/11585; H01L 27/1159; H01L 27/11592;

(Continued)

(56) References Cited

U.S. PATENT DOCUMENTS

| | | |
|---|---|---|
| 9,859,290 B1 | 1/2018 | Wang et al. |
| 9,966,465 B1 | 5/2018 | Chin et al. |

(Continued)

FOREIGN PATENT DOCUMENTS

| | | | | |
|---|---|---|---|---|
| CN | 112086431 A | * | 12/2020 | ......... H01L 23/5223 |
| EP | 3629329 A1 | * | 4/2020 | ........... G11C 11/223 |

(Continued)

*Primary Examiner* — Matthew E Warren
(74) *Attorney, Agent, or Firm* — Myers Bigel, P.A.

(57) ABSTRACT

Semiconductor devices may include a stacked structure including interlayer insulating layers and gate electrodes alternately stacked in a vertical direction, a core region extending in the vertical direction in the stacked structure, a channel layer on a side surface of the core region and facing the gate electrodes and the interlayer insulating layers, a first dielectric layer, a data storage layer and a second dielectric layer, which are between the channel layer and the gate electrodes in order, and an anti-ferroelectric layer including a portion interposed between the first dielectric layer and a first gate electrode of the gate electrodes. The second dielectric layer may contact the channel layer. The anti-ferroelectric layer may be formed of an anti-ferroelectric material having a tetragonal phase.

20 Claims, 14 Drawing Sheets

(52) U.S. Cl.
CPC ............ *H10B 43/40* (2023.02); *H10B 51/30*
(2023.02); *H10B 51/40* (2023.02)

(58) Field of Classification Search
CPC ............ H01L 27/11397; H01L 29/516; H01L
29/517; H01L 29/78391; H01L 29/7926;
H10B 43/20; H10B 43/30; H10B 43/40;
H10B 51/20; H10B 51/30; H10B 51/40
See application file for complete search history.

(56) References Cited

U.S. PATENT DOCUMENTS

| | | |
|---|---|---|
| 10,374,054 B2 | 8/2019 | Yoo |
| 10,468,495 B2 | 11/2019 | Lin et al. |
| 10,522,564 B2 | 12/2019 | Yoo |
| 2004/0051126 A1 | 3/2004 | Cuchiaro et al. |
| 2007/0284651 A1 | 12/2007 | Sim et al. |
| 2011/0073866 A1 | 3/2011 | Kim et al. |
| 2017/0256552 A1 | 9/2017 | Schröder et al. |
| 2018/0277647 A1 | 9/2018 | Yoo |
| 2018/0358380 A1* | 12/2018 | Yoo ................... H01L 27/11597 |
| 2021/0074727 A1* | 3/2021 | Prasad .............. H01L 29/40111 |

FOREIGN PATENT DOCUMENTS

| | | | |
|---|---|---|---|
| EP | 3706167 A1 * | 9/2020 | ............... H01G 7/06 |
| KR | 100760633 B1 | 9/2007 | |
| KR | 1020110034816 A | 4/2011 | |
| KR | 1020170102428 A | 9/2017 | |
| KR | 1020180106660 A | 10/2018 | |
| KR | 1020190046092 A | 5/2019 | |

* cited by examiner

MEMORY SEMICONDUCTOR DEVICES COMPRISING AN ANTI-FERROELECTRIC MATERIAL

CROSS-REFERENCE TO RELATED APPLICATION(S)

This application claims the benefit under 35 USC 119(a) of Korean Patent Application No. 10-2020-0076621 filed on Jun. 23, 2020, in the Korean Intellectual Property Office, the entire disclosure of which is incorporated herein by reference for all purposes.

BACKGROUND

The present inventive concept relates to a semiconductor device.

As demand for high performance, high speed and/or multifunctional semiconductor devices increases, a degree of integration of semiconductor devices increases. To increase the degree of integration, semiconductor devices including gates arranged three-dimensionally have been proposed.

SUMMARY

A technical problem of the present inventive concept is to provide a semiconductor device having an increased degree of integration.

A technical problem of the present inventive concept is to provide a semiconductor device having improved reliability.

According to some embodiments of the present inventive concept, semiconductor devices are provided. The semiconductor devices may include a lower structure; a stacked structure including interlayer insulating layers and gate electrodes alternately stacked on the lower structure in a vertical direction; a channel hole extending through the stacked structure in the vertical direction; a core region in the channel hole in the stacked structure and extending in the vertical direction; a channel layer on a side surface of the core region and facing the gate electrodes and the interlayer insulating layers; a first dielectric layer, a data storage layer and a second dielectric layer disposed between the channel layer and the gate electrodes in order, the first dielectric layer adjacent to the gate electrodes and the second dielectric layer in contact with the channel layer; and an anti-ferroelectric layer comprising a portion interposed between the first dielectric layer and a first gate electrode of the gate electrodes. The anti-ferroelectric layer may be formed of an anti-ferroelectric material having a tetragonal phase.

According to some embodiments of the present inventive concept, semiconductor devices are provided. The semiconductor devices may include a lower structure; a stacked structure including interlayer insulating layers and gate electrodes alternately stacked on the lower structure in a vertical direction; a channel hole extending through the stacked structure in the vertical direction; a core region in the channel hole in the stacked structure and extending in the vertical direction; a channel layer on a side surface of the core region and facing the gate electrodes and the interlayer insulating layers; a first dielectric layer, a data storage layer and a second dielectric layer disposed between the channel layer and the gate electrodes in order, the first dielectric layer adjacent to the gate electrodes and the second dielectric layer in contact with the channel layer; and an anti-ferroelectric layer comprising portions interposed between the first dielectric layer and the gate electrodes. The anti-ferroelectric layer may be formed of an anti-ferroelectric material having a tetragonal phase, the gate electrodes comprise word lines, and the anti-ferroelectric material of the anti-ferroelectric layer disposed between the word lines and the channel layer has a dynamic dielectric constant varying in accordance with a magnitude of an electric field generated between the word lines and the channel layer. In some embodiments, a first gate electrode of the gate electrodes is a portion of a word line of a memory cell, and the anti-ferroelectric material of the anti-ferroelectric layer may have a dynamic dielectric constant that varies corresponding to a magnitude of an electric field between the word line and the channel layer.

According to some embodiments of the present inventive concept, semiconductor devices are provided. The semiconductor device may include a lower structure; a stacked structure including interlayer insulating layers and gate electrodes alternately stacked on the lower structure in a vertical direction; a channel hole extending through the stacked structure in the vertical direction; a core region in the channel hole in the stacked structure and extending in the vertical direction; a channel layer on a side surface of the core region and facing the gate electrodes and the interlayer insulating layers; a first dielectric layer, a data storage layer and a second dielectric layer disposed between the channel layer and the gate electrodes in order, the first dielectric layer adjacent to the gate electrodes and the second dielectric layer in contact with the channel layer; an anti-ferroelectric layer comprising a portion interposed between the first dielectric layer and the gate electrodes, a pad pattern in contact with the channel layer on the core region; a contact plug in contact with the pad pattern on the pad pattern; and a bit line electrically connected to the contact plug on the contact plug, wherein the anti-ferroelectric layer is formed of an anti-ferroelectric material having a tetragonal phase, the gate electrodes comprise word lines, and the anti-ferroelectric material of the anti-ferroelectric layer interposed between the word lines and the channel layer has a dynamic dielectric constant varying in accordance with a magnitude of an electric field generated between the word lines and the channel layer. In some embodiments, a first gate electrode of the gate electrodes is a portion of a word line of a memory cell, and the anti-ferroelectric mated al of the anti-ferroelectric layer may have a dynamic dielectric constant that varies corresponding to a magnitude of an electric field between the word line and the channel layer.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
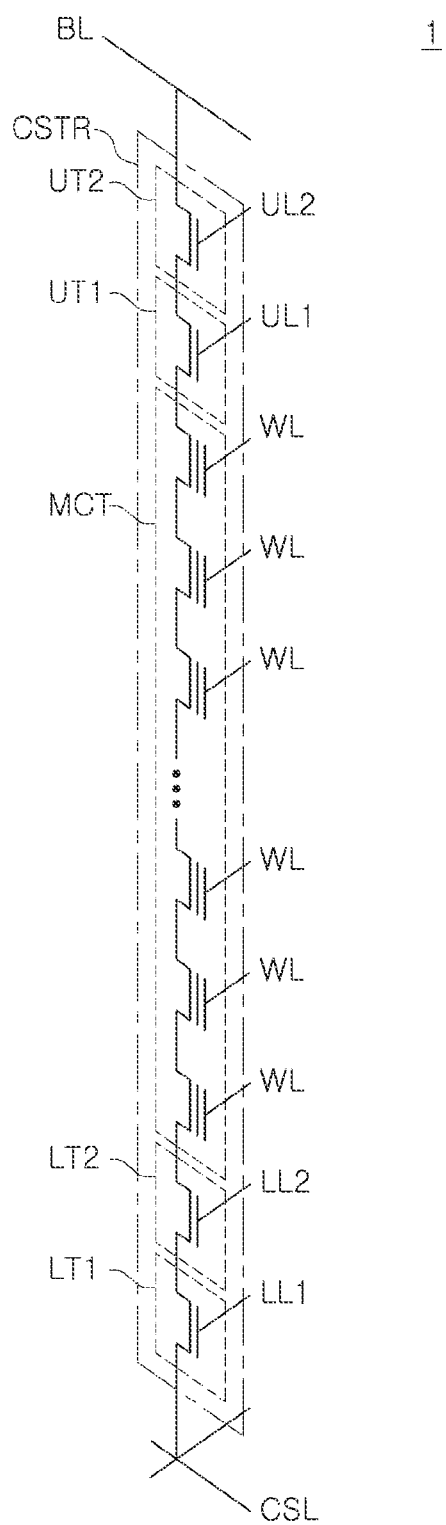
FIG. 1 is a schematic circuit diagram of an example of a semiconductor device according to some embodiments of the present inventive concept.

FIG. 1 is a schematic circuit diagram of an example of a semiconductor device according to some embodiments of the present inventive concept of the present inventive concept.

Referring to FIG. 1, a semiconductor device 1 according to some embodiments of the present inventive concept may include a bit line BL, a common source line CSL, word lines WL, upper gate lines UL1 and UL2, lower gate lines LL1 and LL2 and a cell string CSTR between the bit line BL and the common source line CSL.

The cell string CSTR may include one or more lower transistors LT1 and LT2 adjacent to the common source line CSL, and one or more upper transistors UT1 and UT2 adjacent to the bit line BL, and a plurality of memory cell transistors MCT disposed between the one or more of the lower transistors LT1 and LT2 and the one or more of the upper transistors UT1 and UT2.

The one or more of the lower transistors LT1 and LT2, a plurality of the memory cell transistors MCT and the one or more of the upper transistors UT1 and UT2 may be connected in series.

In some embodiments, the one or more of the upper transistors UT1 and UT2 may include a string selection transistor, and the one or more of the lower transistors LT1 and LT2 may include a ground selection transistor.

In some embodiments, the one or more of the lower transistors LT1 and LT2 may be provided in plural, and a plurality of the lower transistors LT1 and LT2 may include a lower erase control transistor LT1 connected in series and a ground selection transistor LT2. The ground selection transistor LT2 may be disposed on the lower erase control transistor LT1.

In some embodiments, the one or more of the upper transistors UT1 and UT2 may be provided in plural, and a plurality of the upper transistors UT1 and UT2 may include a string select transistor UT1 connected in series and an upper erase control transistor UT2. The upper erase control transistor UT2 may be disposed on the string selection transistor UT1.

The lower gate lines LL1 and LL2 may include a first lower gate line LL1 and a second lower gate line LL2, and the upper gate lines UL1 and UL2 may include a first upper gate line UL1 and a second upper gate line UL2.

The first lower gate line LL1 may be a gate electrode of the lower erase transistor LT1, and the second lower gate line LL2 may be a gate electrode of the ground selection transistor LT2. The word lines WL may be or may include gate electrodes of the memory cell transistors MCT, while the first upper gate line UL1 may be a gate electrode of the string selection transistor UT1, and the second upper gate line UL2 may be a gate electrode of the upper erase transistor UT2. In some embodiments, each of the gate electrodes of the memory cell transistors MCT may be a portion of a respective one of the word lines WL.

An erasing operation for erasing information stored in the memory cell transistors MCT may use gate induced drain leakage (GIDL) occurring in the lower and upper erase control transistors LT1 and UT2. For example, a hole generated by the GIDL in the lower and upper erase transistors LT1 and UT2 is injected into a channel of the memory cell transistors MCT, and data of the memory cell transistors MCT may be erased by the hole injected into the channel of the memory cell transistors MCT. For example, the hole injected into the channel of the memory cell transistors MCT may allow an electron trapped in a data storage layer of the memory cell transistors MCT to escape to the channel of the memory cell transistors MCT.

Figure 2:
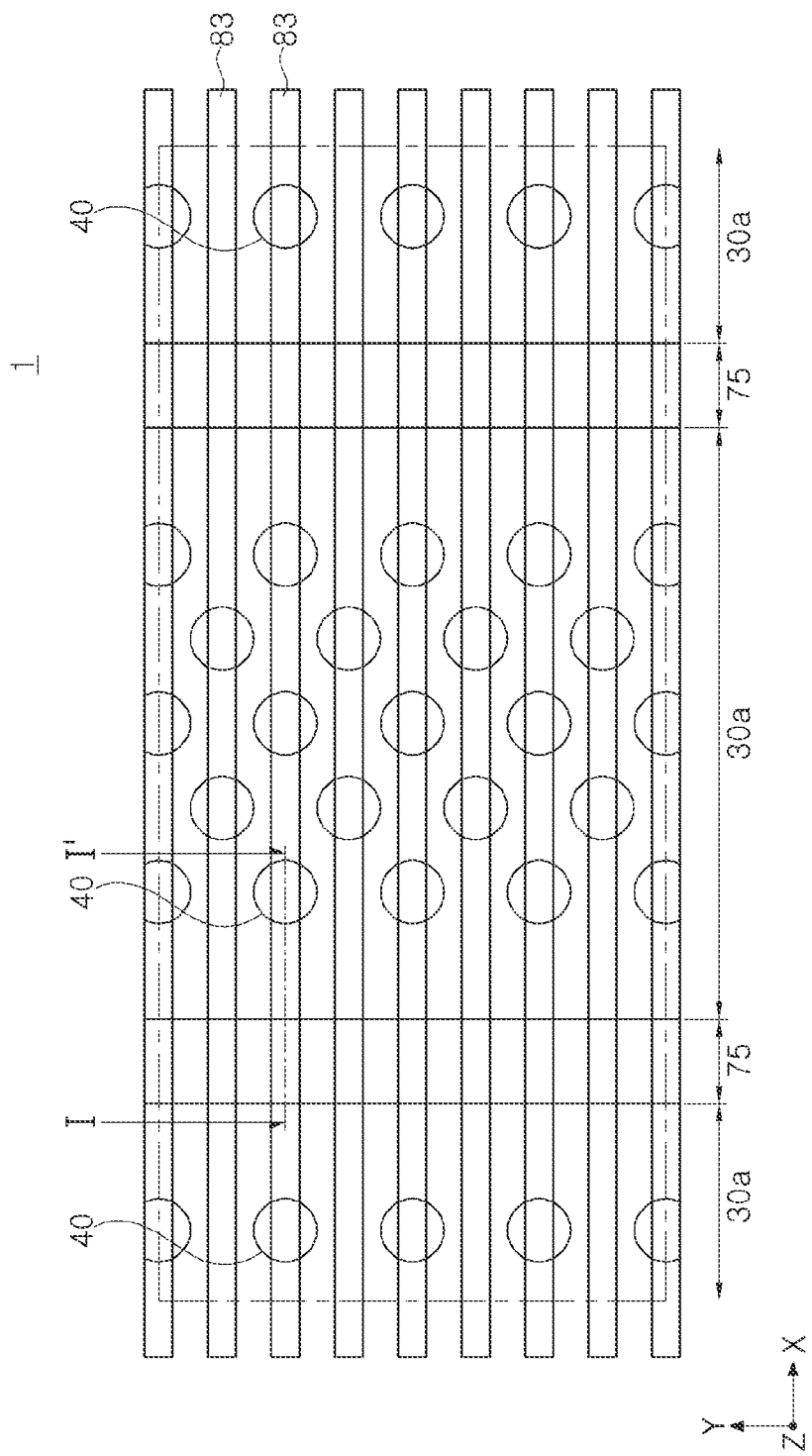
FIG. 2 is a planar view of an example of a semiconductor device according to some embodiments of the present inventive concept.

An example of a semiconductor device according to some embodiments of the present inventive concept will be described with reference to FIGS. 2 and 3. FIG. 2 is a planar view of an example of a semiconductor device according to some embodiments of the present inventive concept, and FIG. 3 is a cross-sectional view of a region taken along line I-I' of FIG. 2.

Figure 3:
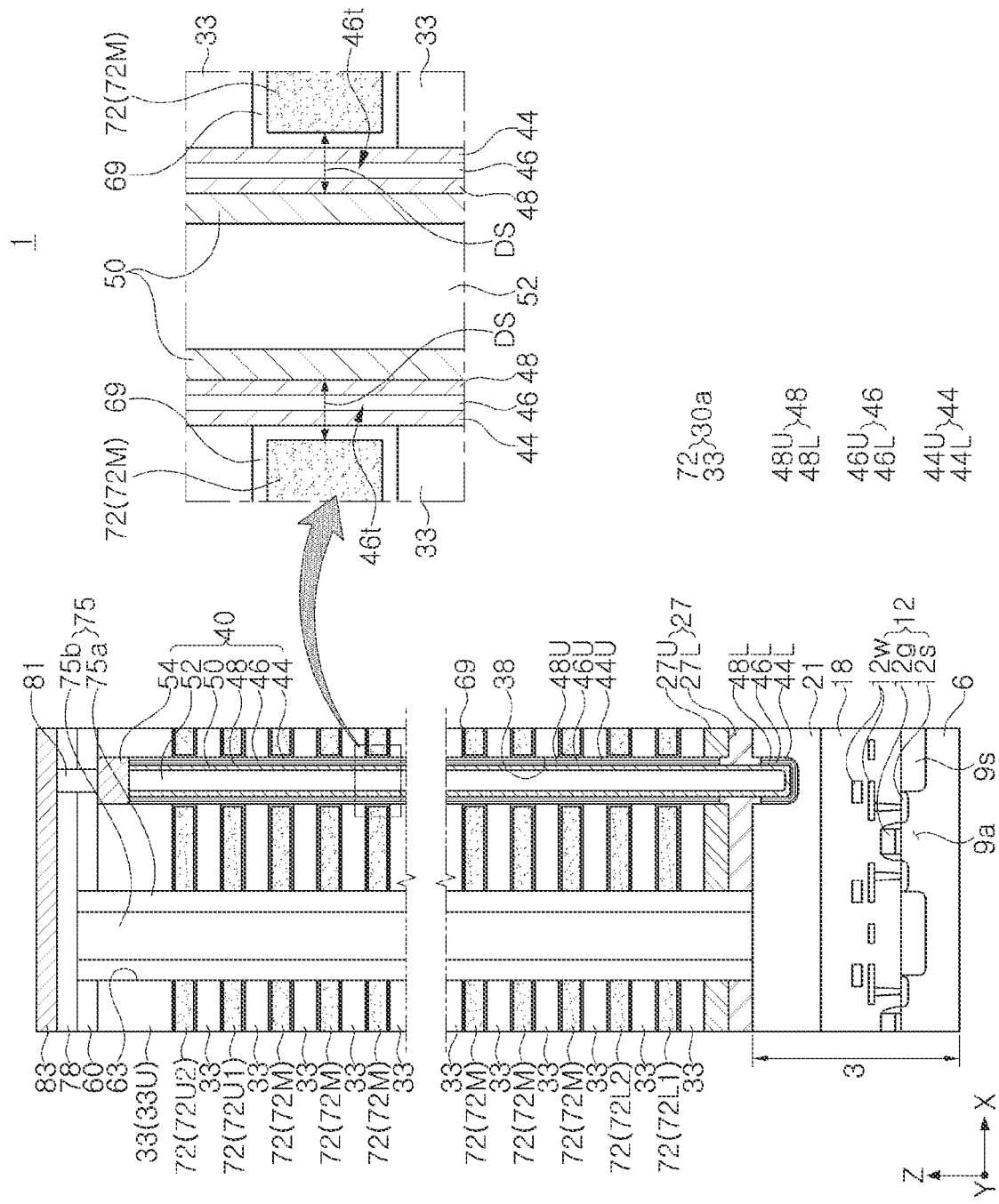
FIG. 3 is a cross-sectional view of an example of a semiconductor device according to some embodiments of the present inventive concept.

Referring to FIGS. 2 and 3, a semiconductor device 1 according to some embodiments of the present inventive concept includes a lower structure 3, a stack structure 30a, a vertical structure 40 and an anti-ferroelectric layer 69.

In some embodiments of the present inventive concept, the semiconductor device 1 may further include a horizontal connecting layer 27.

In some embodiments of the present inventive concept, the semiconductor device 1 may further include a first upper insulating layer 60, a separation structure 75, a second upper insulating layer 78, a contact plug 81 and a bit line 83.

The lower structure 3 may include a semiconductor substrate 6, a peripheral circuit 12 formed on the semiconductor substrate 6, a lower insulating layer 18 and a lower pattern layer 21. The semiconductor substrate 6 may be, for example, a single crystal silicon substrate. The peripheral circuit 12 may be a circuit for an operation of a memory cell array of a NAND flash memory device. The peripheral circuit 12 may include peripheral transistors 12g and 12s, each of which includes a peripheral gate 12g and a peripheral source/drains 12s, and a peripheral wiring 12w. The peripheral gate 12g may be formed on ac active region 9a defined by an isolation layer 9s formed in the semiconductor substrate 6. The peripheral source/drains 12s may be formed adjacent to opposing sides of the peripheral gate 12g, respectively, in the active region 9a. The lower insulating layer 18 may cover the peripheral circuit 12. The lower pattern layer 21 may include, for example, polysilicon. The lower pattern layer 21 may include, for example, doped polysilicon. For example, the lower pattern layer 21 may include polysilicon having an N-type conductivity.

The stacked structure 30a may be disposed on the lower structure 3. The stacked structure 30a may include interlayer insulating layers 33 and gate electrodes 72 repeatedly and alternately stacked in a vertical direction Z. The vertical direction Z may be a direction perpendicular to an upper surface of the lower structure 3. The interlayer insulating layers 33 may be formed of, for example, a silicon oxide. An uppermost interlayer insulating layer 33U of the interlayer insulating layers 33 may have a largest thickness as compared to thicknesses of the remaining interlayer insulating layers. The gate electrodes 72 max include doped silicon, a metal nitride (e.g., TiN), a metal (e.g., W) and/or a metal-semiconductor compound (e.g., TiSi or WSi). As used herein the term "and/or" includes any and all combinations of one or more of the associated listed items. Further, as used herein, "an element A is formed of a material B" (or similar language) means that the element A includes the material B or the element A consists of the material B.

In some embodiments, the gate electrodes 72 may include one or more of lower gate electrodes 72L1 and 72L2, one or more of upper gate electrodes 72U1 and 72U2, and middle gate electrodes 72M between the one or more of the lower gate electrodes 72L1 and 72L2 and the one or more of the upper gate electrodes 72U1 and 72U2. The one or more of the lower gate electrodes 72L1 and 72L2 may be provided in plural and may include a first lower gate electrode 72L1 and a second lower gate electrode 72L2 formed on first lower gate electrode 72L1. The upper gate electrodes 72U1 and 72U2 may be provided in plural and may include a first upper gate electrode 72U1 and a second upper gate electrode 72U2 formed on first upper gate electrode 72U1. The first and second lower gate electrodes 72L1 and 72L2 may correspond to the first and second lower gate lines LL1 and LL2 described in FIG. 1. The first and second upper gate electrodes 72U1 and 72U2 may correspond to the first and second upper gate lines UL1 and UL2 described in FIG. 1. At least some of the middle gate electrodes 72M may correspond to the word lines WL described in FIG. 1.

The horizontal connection layer 27 may be interposed between the lower structure 3 and the stacked structure 30a.

In some embodiments, the horizontal connection layer 27 may include a lower horizontal connection layer 27L and an upper horizontal connection layer 27U on the lower horizontal connection layer 27L in contact therewith. The lower horizontal connection layer 27L may include, for example, a silicon layer (for example, a silicon layer having an N-type conductivity). The lower horizontal connection layer 27L may be in contact with the lower pattern layer 21. The lower horizontal connection layer 27L may constitute at least a portion of the common source line CSL as illustrated in FIG. 1.

The vertical structure 40 may extend in the vertical direction Z and may pass through the stacked structure 30a. The vertical structure 40 passes through the stacked structure 30a and may be disposed inside a hole 38 extending into the lower structure 3. The vertical structure 40 passes through the stacked structure 30a and the horizontal connection layer 27 and may extend into the lower pattern layer 21 of the lower structure 3.

In some embodiments, the vertical structure 40 may include a core region 52, a channel layer 50, a first dielectric layer 44, a data storage layer 46, a second dielectric layer 48 and a pad pattern 54.

The core region 52 may be spaced apart from a side wall of the channel hole 38. The core region 52 may extend in the vertical direction Z and may have a side surfaces facing the gate electrodes 72 and the horizontal connection layer 27. A bottom surface of the core region 52 may be disposed at a level lower than that of an upper surface of the lower pattern layer 21. The core region 52 may include a silicon oxide or a silicon oxide including a void therein.

The channel layer 50 may extend on or cover a side surface and a bottom surface of the core region 52. The channel layer 50 may be formed of, for example, a silicon layer. As used herein, "an element A covers a surface of an element B" (or similar language) means that the element A is on and overlaps the surface of the element B but does not necessarily mean that the element A covers the surface of the element B entirely.

The data storage layer 46 may be interposed between the first and second dielectric layers 44 and 48.

In some embodiments, the data storage layer 46 may be formed of a material capable of storing information in a memory device. The data storage layer 46 may include information storing regions 46t interposed between the channel layer 50 and the middle gate electrodes 72M, which may be the word lines (WL of FIG. 1). In a single vertical structure 40, the information storing regions 46t may be arranged along the vertical direction Z and may be spaced apart from each other in the vertical direction Z.

The data storage layer 46 may be formed of a material capable of storing information by trapping a charge in a flash memory device. The data storage layer 46 may be formed of, for example, a silicon nitride. In example embodiments, the silicon nitride of the data storage layer 46 may be replaced with another material capable of storing information.

The second dielectric layer 48 may be in contact with the channel layer 50. The first dielectric layer 44 may be adjacent to the gate electrodes 72 and the interlayer insulating layer 33. The first dielectric layer 44 may be in contact with the anti-ferroelectric layer 69. The anti-ferroelectric layer 69 may include portions in contact with the gate electrodes 72. The pad pattern 54 may be disposed on the core region 52 and may be in contact with the channel layer 50. The pad pattern 54 may include, for example, polysilicon having an N-type conductivity.

At least a portion of the channel layer 50, facing the middle gate electrodes 72M, may be formed of, for example, an undoped silicon layer. In the channel layer 50, a portion adjacent to the pad pattern 54 may have an N-type conductivity.

The lower horizontal layer 27L may be in contact with the channel layer 50 while passing through the first dielectric layer 44, the data storage layer 46 and the second dielectric layer 48 in a horizontal direction (X, Y). The first dielectric layer 44 may be divided into a first lower dielectric layer 44L and a first upper dielectric layer 44U by the lower horizontal layer 27L, while the data storage layer 46 may be divided into a lower data storage layer 46L and an upper data storage layer 46U by the lower horizontal layer 27L, and the second dielectric layer 48 may be divided into a second lower dielectric layer 48L and a second upper dielectric layer 48U by the lower horizontal layer 27L.

The anti-ferroelectric layer 69 may include portions positioned between the vertical structure 40 and the stacked structure 30a. For example, the anti-ferroelectric layer 69 may be interposed between each of the gate electrodes 72 and the vertical structure 40. The anti-ferroelectric layer 69 may cover upper and lower surfaces of each of the gate electrodes 72 and may be interposed between the gate electrodes 72 and the first dielectric layer 44 of the vertical structure 40. The anti-ferroelectric layer 69 may be in contact with the gate electrodes 72.

In some embodiments, the anti-ferroelectric layer 69 may have a tetragonal phase.

In some embodiments, the anti-ferroelectric layer 69 may include a hafnium (Hf)-based oxide. For example, the anti-ferroelectric layer 69 may include a Hf-based oxide doped with an impurity. The impurity may include Zr, Al, Si and/or La.

In some embodiments, the anti-ferroelectric layer 69 may include a zirconium (Zr)-based oxide. For example, the anti-ferroelectric layer 69 may include a Zr-based oxide doped with an impurity. The impurity may include Hf, Al, Si and/or La.

Each of the first and second dielectric layers 44 and 48 may include an oxide layer having a dielectric constant lower than a dielectric constant (e.g., a lowest dielectric constant) of the anti-ferroelectric layer 69. For example, the anti-ferroelectric layer 69 may have a dynamic dielectric constant in the range of about 25 to about 45, and the first and second dielectric layers 44 and 48 may have a lower dielectric constant as compared to the anti-ferroelectric layer 69. In some embodiments, the first dielectric layer 44 may be a silicon oxide, and the second dielectric layer 48 may be a silicon oxide or a silicon oxide doped with an impurity. For example, the second dielectric layer 48 may be a silicon oxide doped with nitrogen.

The first and second upper insulating layers 60 and 78 may be stacked on the stacked structure 30a in order.

The separation structure 75 may pass through the first upper insulating layer 60, the stacked structure 30a and the horizontal connection layer 27.

In some embodiments, the separation structure 75 may include a separating core pattern 75b and a separating spacer 75a on a side surface of the separating core pattern 75b.

In some embodiments, the separating core pattern 75b may be formed of a conductive material, and the separating spacer 75a may be formed of an insulating material.

In some embodiments, each of the separating core pattern 75b and the separating spacer 75a may be formed of an insulating material.

In some embodiments, the separation structure 75 may be formed of a single insulating material. The separation structure 75 may be a unitary structure and may be monolithic.

The contact plug 81 may pass through the first and second upper insulating layers 60 and 78 and may be electrically connected to the vertical structure 40. For example, the contact plug 81 may be in contact with the pad pattern 54 of the vertical structure 40. The bit lines 83 may be electrically connected to the contact plug 81 on the second upper insulating layer 78.

The bit line 83 may correspond to the bit line BL described in FIG. 1, and the lower pattern layer 21 and the horizontal connection layer 27 may correspond to the common source line CSL described in FIG. 1.

The first lower transistor LT1 described in FIG. 1 may include the first lower gate electrode 72L1, and dielectric structures 69, 44, 46 and 48 interposed between the first lower gate electrode 72L1 and the channel layer 50. The second lower transistor LT2 described in FIG. 1 may include the second lower gate electrode 72L2, and dielectric structures 69, 44, 46 and 48 interposed between the second lower gate electrode 72L2 and the channel layer 50.

The first upper transistor UT1 described in FIG. 1 may include the first upper gate electrode 72U1, and dielectric structures 69, 44, 46 and 48 interposed between the upper lower gate electrode 72U1 and the channel layer 50. The second upper transistor UT2 described in FIG. 1 may include the second upper gate electrode 72U2, and dielectric structures 69, 44, 46 and 48 interposed between the second upper gate electrode 72U2 and the channel layer 50.

The memory cell transistors MCT described in FIG. 1 may include the middle gate electrodes 72M, and dielectric structures 69, 44, 46 and 48 interposed between the the middle gate electrodes 72M and the channel layer 50.

The dielectric structures 69, 44, 46 and 48 may be denoted collectively as "DS" in FIG. 3. The dielectric structure DS may be referred to as another term. For example, the dielectric structure DS may be referred to as an information storing structure or a data storage structure.

Hereinbelow, the dielectric structure DS, although not additionally mentioned, may be understood as including the anti-ferroelectric layer 69, the first dielectric layer 44, the data storage layer 46 and the second dielectric layer 48.

With reference to FIGS. 4A to 5B, characteristics of any one memory cell transistor, among the memory cell transistors MCT, will be described at the time of programming and erasing operations.

Figure 4A:
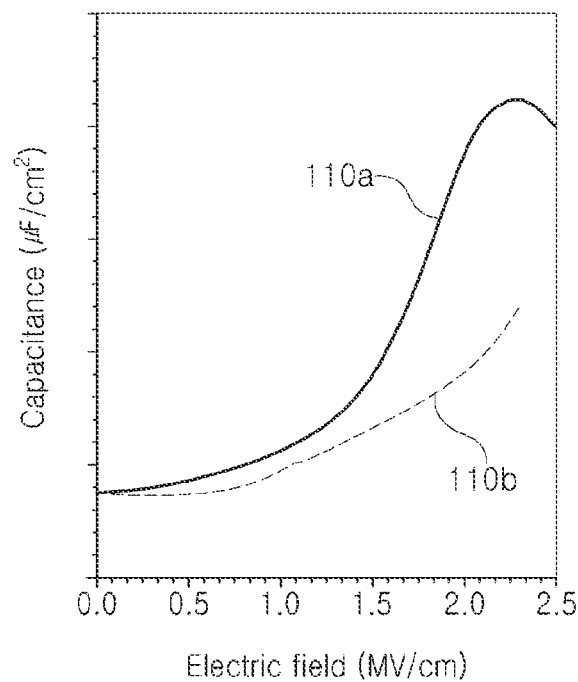
FIGS. 4A to 8 are diagrams illustrating electrical characteristics of a semiconductor device according to some embodiments of the present inventive concept.
Figure 4B:
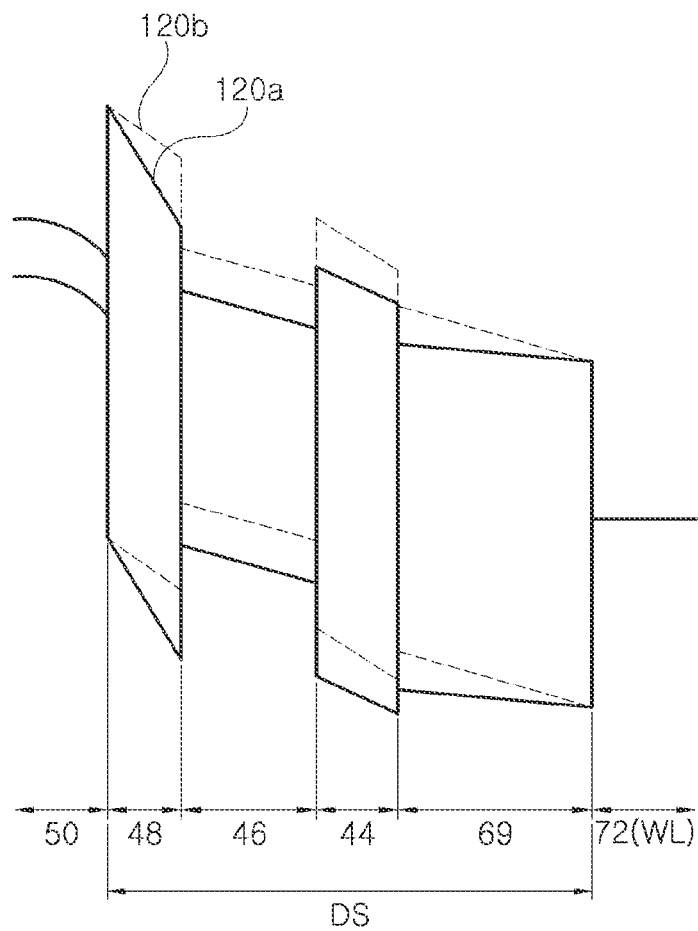
Figure 5A:
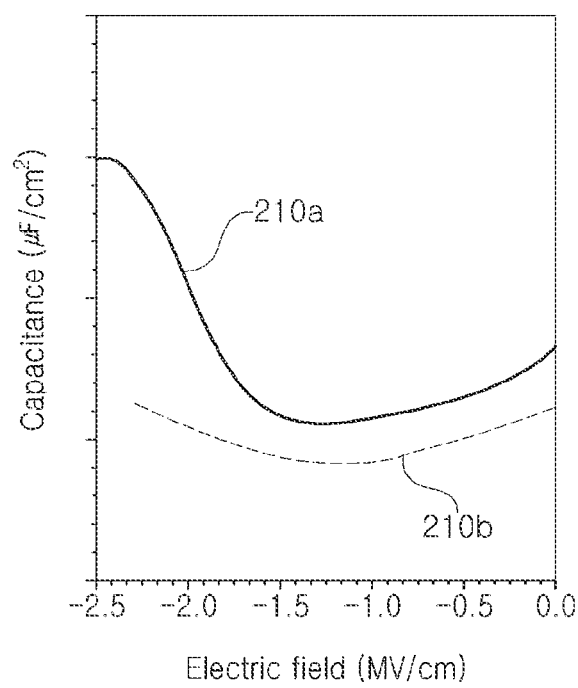
Figure 5B:
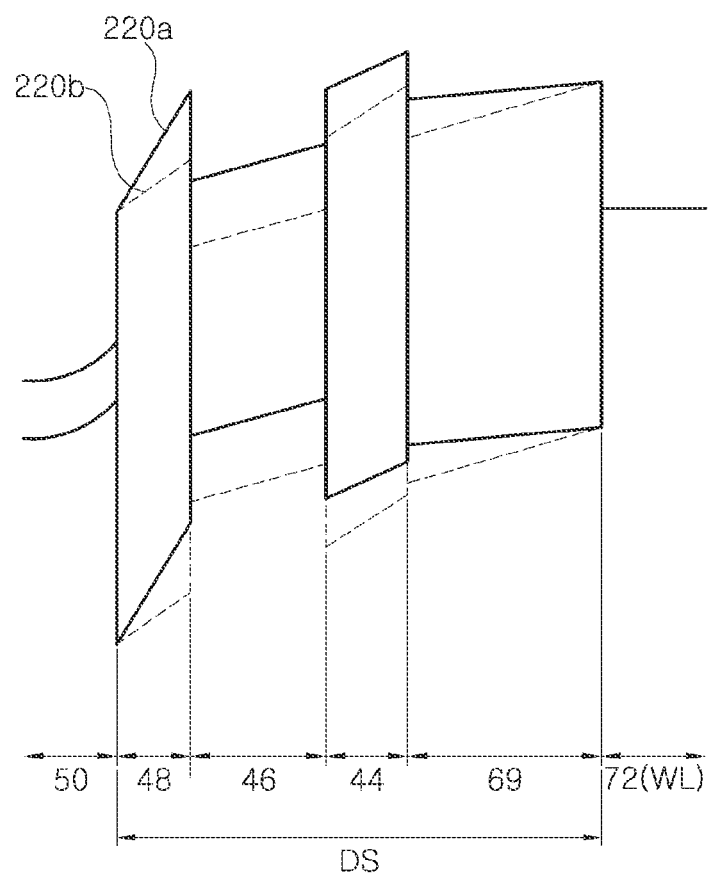

FIGS. 4A and 5A illustrate capacitance between the middle gate electrode 72M, which may be the word line WL, and the channel layer 50 in a first memory cell transistor (110a in FIG. 4A and 210a in FIG. 5A), in which the anti-ferroelectric layer 69 is formed of $HfZrO_2$ having a tetragonal phase, as a line, and capacitance between the middle gate electrode 72M, which may be the word line WL, and the channel layer 50 in a second memory cell transistor (110b in FIG. 4A and 210b in FIG. 5A), in which the anti-ferroelectric layer 69 formed of $HfiZrO_2$ is replaced with that formed of $ZrO_2$, as a dotted line. FIGS. 4B and 5B illustrate energy band diagrams of the channel layer 50, the second dielectric layer 48, the data storage layer 46, the first dielectric layer 44, the anti-ferroelectric layer 69 and the word lines WL of the first memory cell transistor (110a in FIG. 4A) with the lines of 120a, of FIG. 4B and 220a of FIG. 5B and that of a case in which a general dielectric layer is employed in place of the anti-ferroelectric layer 69 is indicated with the dotted lines of 120b of FIG. 4B and 220b of FIG. 5B.

FIG. 4A illustrates an electric field and capacitance at the time of programming operation, and FIG. 4B illustrates an energy band diagram at the time of programming operation. FIG. 5A illustrates an electric field and capacitance at the time of erasing operation, and FIG. 5B illustrates an energy band diagram at the time of erasing operation. The programming operation may involve grounding the channel layer 50 or applying 0V to the channel layer 50 and a positive voltage, for example, about 9V to about 27V, to the word line WL to inject electrons into the data storage layer 46.

The erasing operation may involve allowing the electrons trapped in the data storage layer 46 to escape to the channel layer 50. For example, the erasing operation may involve grounding the channel layer 50 or applying 0V to the channel layer 50 and a negative voltage, for example, about −9V to about −27V, to the word line WL to allow the electrons trapped in the channel layer 50 to escape to the channel layer 50. In some embodiments, the erasing operation may involve injecting a hole generated in the lower and upper erase transistors LT1 and UT2 by gate induced drain leakage (GIDL) into the channel layer 50 facing the middle gate electrodes 721, which may be the word lines WL, and allowing the electrons trapped in the data storage layer 46 facing the middle gate electrodes 72M, which may be the word lines WL, to escape to the channel layer 50.

Referring to FIG. 4A, capacitance of the first memory cell transistor 110a in an electric field (e.g., an electric field between the word line selected for programming and the channel layer 50) of about 1 MV/cm or greater, which corresponds to an electric field during the programming operation, is increased, as compared to that in an electric field close to 0. This result indicates that the anti-ferroelectric layer 69 of the first memory cell transistor 110a may have an increased dielectric constant in the programming operation region in which the electric field is about 1 MV/cm or greater. Accordingly, it is understood that the anti-ferroelectric layer 69 of the first memory cell transistor 110a may have a dynamic dielectric constant increasing in accordance with the programming operation.

In some embodiments, in the case in which the anti-ferroelectric layer 69 is formed of $HfZrO_2$ having a tetragonal phase having a dielectric constant of about 37.6, $HfZrO_2$ may vary to have a dielectric constant greater than 37.6 or equal to or smaller than about 43.3 during the programming operation. Accordingly, the anti-ferroelectric layer 69 may have a dynamic dielectric constant. In some embodiments, the anti-ferroelectric layer 69 that is formed of $HfZrO_2$ having a tetragonal phase may have a dielectric constant of about 37.6 when a magnitude of an electric field between the word line and the channel layer 50 is zero. In some embodiments, the anti-ferroelectric layer 69 may have a first dielectric constant when a magnitude of an electric field between the word line and the channel layer 50 is zero and may have a second dielectric constant during a programming operation of the first memory cell transistor 110a, and the second dielectric constant may be greater than the first dielectric constant.

Referring to FIG. 4B, an electric field applied to the second dielectric layer 48 by the anti-ferroelectric layer 69 of the first memory cell transistor 110a is increased as compared to that by a dielectric layer of a conventional memory cell transistor. In this regard, electrons inside the channel layer 50 are easily injected into the data storage layer 46, thus entrapping the electrons in the data storage layer 46. Accordingly, it can be seen that programming operation performance of the first memory cell transistor 110 according to some embodiments of the present inventive concept is improved.

Referring to FIG. 5A, capacitance of a first memory cell transistor 210a increases in the electric field of about –1.5 MV/cm, which corresponds to an electric field during an erasing operation. At the time of the erasing operation, an anti-ferroelectric layer 69 of the first memory cell transistor 210a may have a dielectric constant increased to about 38 to about 41.1, as compared to the case in which no erasing operation is performed (e.g., a magnitude of an electric field between the word line and the channel layer 50 is zero).

Accordingly, referring to FIGS. 4A and 5A, the anti-ferroelectric layer 69 of the first memory cell transistor 110a has a dynamic dielectric constant increasing in accordance with the programming and erasing operations.

Referring to FIG. 5B, an electric field applied to the second dielectric layer 48 may increase. In this regard, the electrons trapped in the data storage layer 46 may be allowed to easily escape to the channel layer 50, thereby increasing erasing efficiency.

Data retention characteristics of the memory cell transistor according to some embodiments of the present inventive concept will be described with reference to FIGS. 6A and 6B.

Figure 6A:
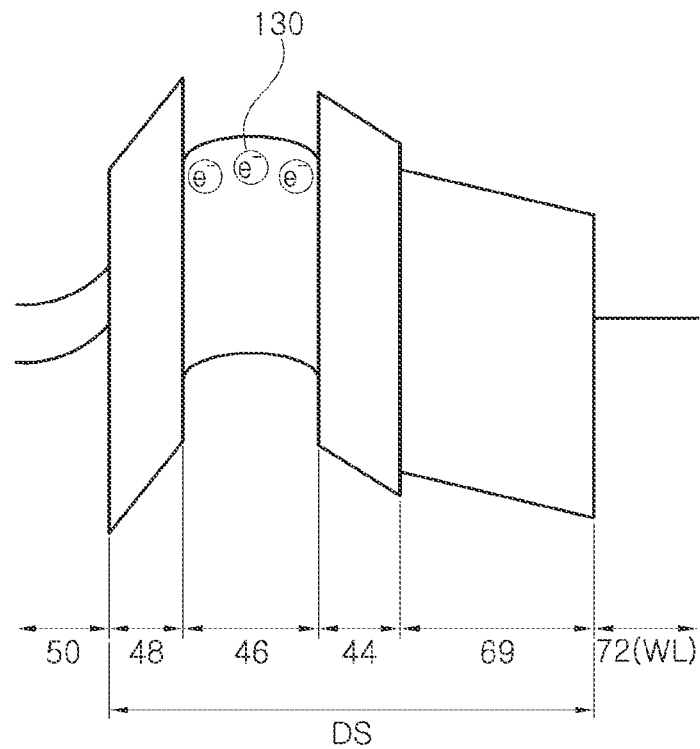
Figure 6B:
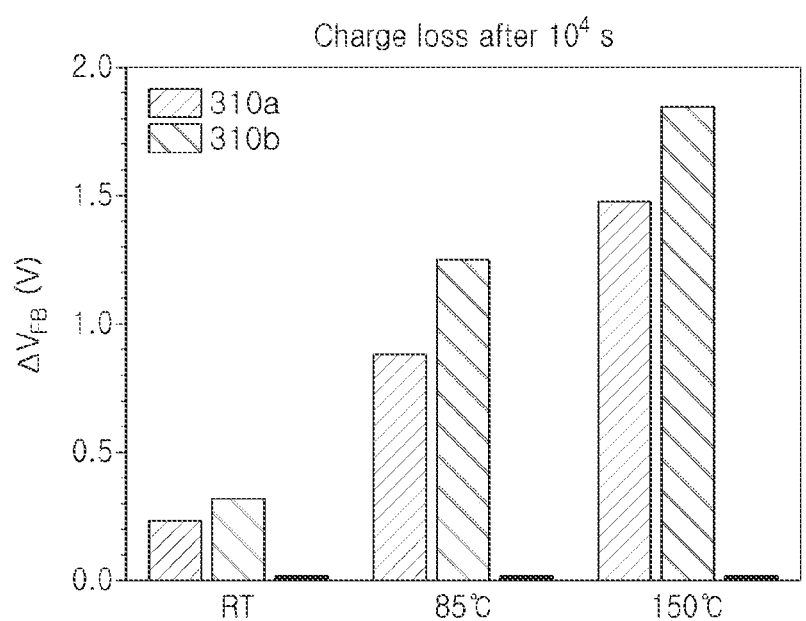

FIG. 6A illustrates an energy band diagram of the first memory cell transistor (110a of FIG. 4A) according to some embodiments of the present inventive concept, in which electrons 130 are trapped in the data storage layer 46 after the programming operation, and FIG. 6B is a graph illustrating a total leakage current after $10^4$ seconds at room temperature, 85° C. and 150° C. after the programming operation. In FIG. 6B, the reference number 310a refers to a value of leakage current of the first memory cell transistor (110A of FIG. 4A), and the reference number 310b refers to a value of leakage current of a memory cell transistor employing a ferroelectric layer instead of the anti-ferroelectric layer 69.

Referring to FIGS. 6A and 6B, a value of leakage current of the first memory cell transistor (110A of FIG. 4A) may be less than a value of leakage current of a memory cell transistor employing a ferroelectric layer. Accordingly, a retention characteristic of the first memory cell transistor (110A of FIG. 4A) including the anti-ferroelectric layer 69 may be better than a retention characteristic of the memory cell transistor employing the ferroelectric layer. Here, the retention characteristic may be a charge retention characteristic or a data retention characteristic.

In example embodiments, anti-ferroelectric materials of the anti-ferroelectric layer 69 interposed between the gate electrodes 72, which may be the word lines WL, and the channel layer 50 may have a dynamic dielectric constant varying depending on a magnitude of an electric field generating between the word lines WL and the channel layer 50.

In example embodiments, the anti-ferroelectric materials of the anti-ferroelectric layer 69 interposed between the gate electrodes 72, which may be the word lines WL, and the channel layer 50 may have an increased dielectric constant at the time of an erasing operation in which electrons trapped in the data storage layer 46 are erased, as compared to that before the erasing operation. In some embodiments, the anti-ferroelectric layer 69 may have a first dielectric constant when a magnitude of an electric field between the word line and the channel layer 50 is zero and may have a second dielectric constant during an erasing operation of the first memory cell transistor 110a, and the second dielectric constant may be greater than the first dielectric constant.

In example embodiments, the word lines WL may include a first word line and a second word line. In the case in which a programming operation voltage is applied to the first word line but not to the second word line, the anti-ferroelectric materials of the anti-ferroelectric layer 69 interposed between the second word line and the channel layer 50 may have a first dielectric constant, and the anti-ferroelectric materials of the anti-ferroelectric layer 69 interposed between the first word line and the channel layer 50 may have a second dielectric constant that is higher than the first dielectric constant.

Endurance characteristics of any one of the memory cell transistors MCT according to some embodiments of the present inventive concept will be described with reference to FIG. 7.

Figure 7:
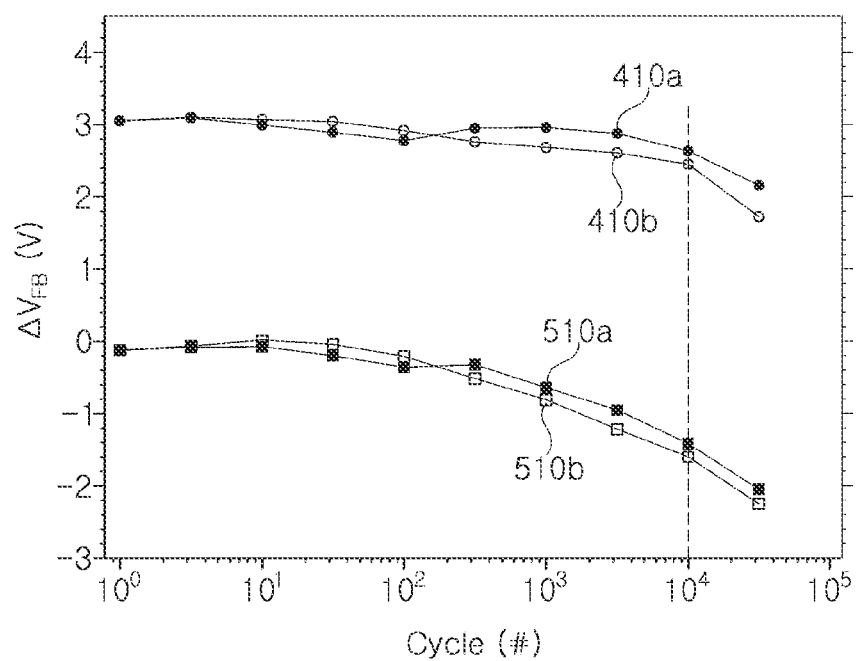

FIG. 7 is a graph evaluating reliability, that is, endurance characteristics of a memory cell transistor during repeatedly performing program PGM and erase ERS operations according to a programming/erasing cycle. In FIG. 7, the reference numbers 410a and 510a are graph lines representing characteristics of a memory cell transistor having the anti-ferroelectric layer 69 formed of $HfZrO_2$, a high-k dielectric material having a tetragonal phase, and reference numbers 410b and 510b are graph lines representing characteristics of a memory cell transistor employing $ZrO_2$ not having a tetragonal phase, instead of the anti-ferroelectric layer 69. Further, in FIG. 7, the graph lines represented by 410a and 410b, positioned in a relatively upper part of the graph, represent a state in the programming operation while those represented by 510a and 510b, positioned in a relatively lower part of the graph, represent a state in the erasing operation.

A most ideal state of the graph lines of FIG. 7 may be constant regardless of the programming/erasing cycle. Generally, graph lines are bent downward by repeatedly performed programming/erasing operations, and endurance is evaluated based on a degree of the bent. In the cycle of $10^4$ of FIG. 7, the graph lines denoted by 410*a* and 510*a* according to example embodiments of the present inventive concept are shown to be bent in a smaller degree as compared to those denoted by 410*b* and 510*b*, a conventional case. Accordingly, it can be understood based on FIG. 7 that endurance of a memory cell transistor including an anti-ferroelectric layer formed of $HfZrO_2$ having a tetragonal phase is improved as compared to that of a memory cell transistor including a conventional dielectric.

Figure 8:
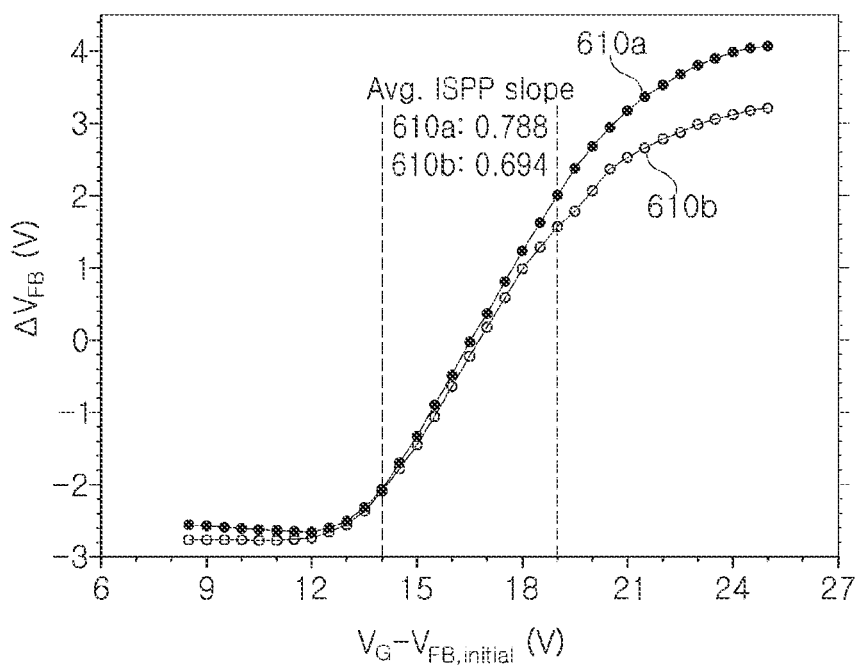

Programming efficiency of a semiconductor device according to some embodiments of the present inventive concept will be described. FIG. 8 is a graph illustrating evaluation of incremental step pulse program (ISPP) characteristics involving repeating a program-verify process (e.g., operation) after repeating the programming/erasing operation $10^4$ cycle in FIG. 7. The reference number 610*a* and 610*b* of FIG. 8 respectively represent the ISPP characteristics of a memory cell transistor having the anti-ferroelectric layer 69 formed of $HfZrO_2$ having a tetragonal phase and that employing $ZrO_2$, a high-k dielectric material not having a tetragonal phase. In FIG. 8, an ISPP slope was extracted in a voltage interval of 14V to 19V, which may represent efficiency of the program operation. In the graph of FIG. 8, an ISPP slope of the memory cell transistor 610*a* including an anti-ferroelectric layer is 0.788 while that of a memory cell transistor 610*b* having a high-k dielectric, not an anti-ferroelectric layer, is 0.694. In this regard, it can be understood that the memory cell transistor 610*a* including an anti-ferroelectric layer 69 according to example embodiments has improved programming operation efficiency as compared to the memory cell transistor 610*b* having a high-k dielectric, not an anti-ferroelectric layer.

A modified example of the anti-ferroelectric layer 69 of FIG. 3 will be described with reference to FIG. 9.

Figure 9:
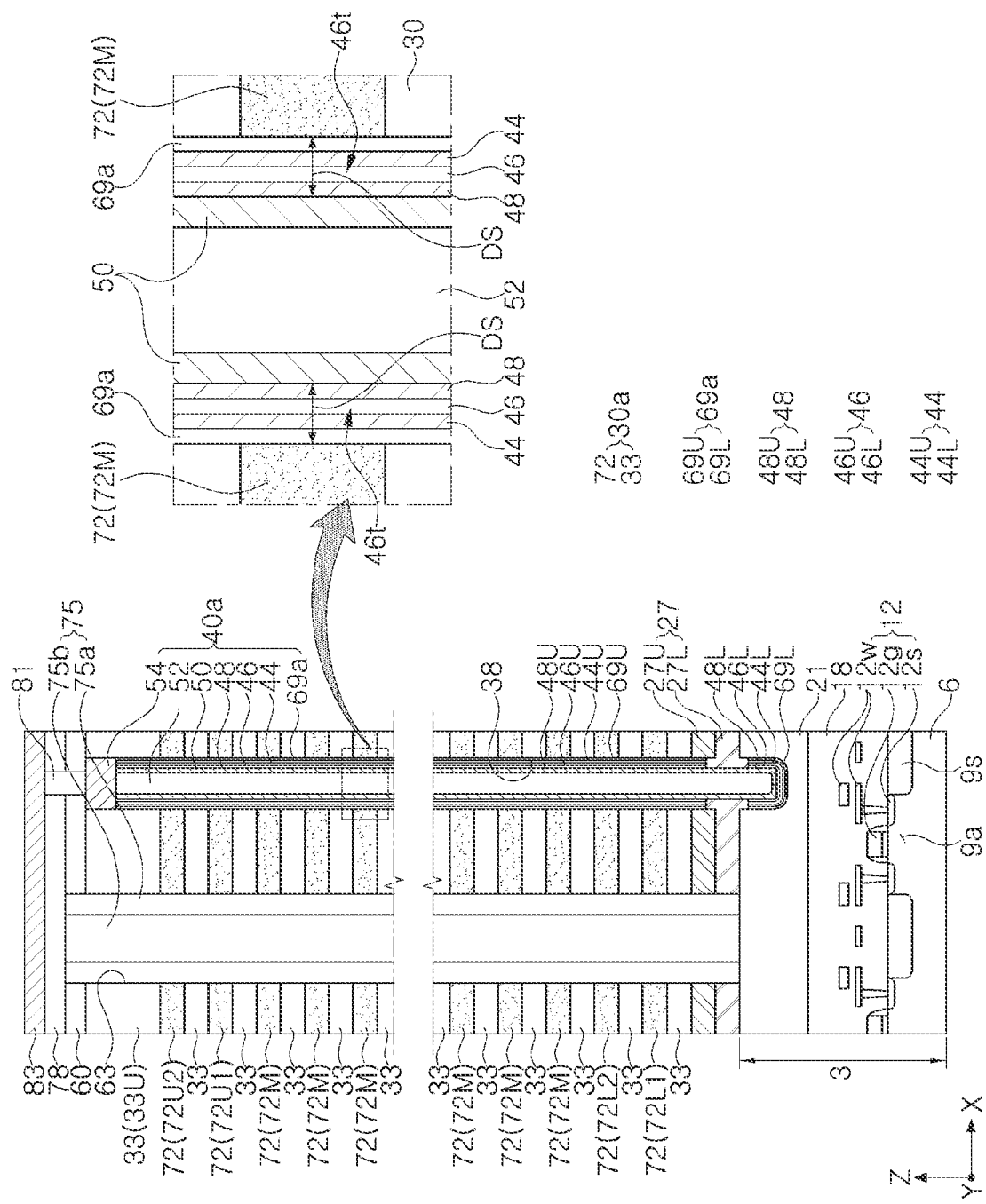
FIG. 9 is a cross-sectional view illustrating a modified example of a semiconductor device according to some embodiments of the present inventive concept.

Referring to FIG. 9, the anti-ferroelectric layer 69 of FIG. 3 may be replaced with an anti-ferroelectric layer 69*a* covering an entire external side surface of the first dielectric layer 44 as shown in FIG. 9. For example, the anti-ferroelectric layer 69*a*, similar to the first dielectric layer 44, may be divided into a lower anti-ferroelectric layer 69L and an upper anti-ferroelectric layer 69U by the lower horizontal layer 27L. The vertical structure 40 described in FIG. 3 may be modified to a vertical structure 40*a* including the anti-ferroelectric layer 69*a*.

Modified examples of the vertical structure 40, the interlayer insulating layers 33 and the gate electrodes 72, described in FIG. 3, will be described with reference to FIG. 10.

Figure 10:
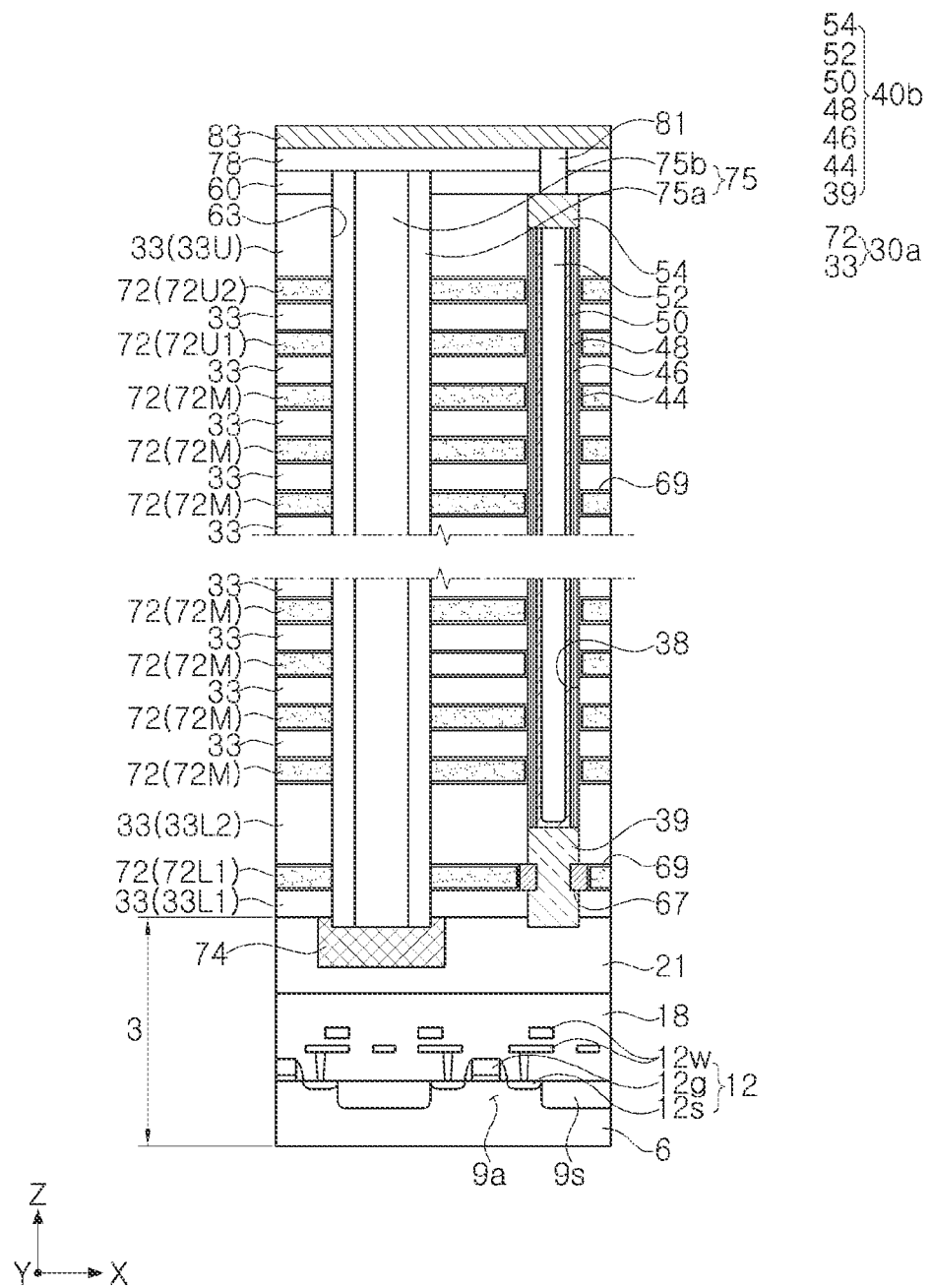
FIG. 10 is a cross-sectional view illustrating a modified example of a semiconductor device according to some embodiments of the present inventive concept.

Referring FIG. 10, the interlayer insulating layers 33 may include a first lower interlayer insulating layer 33L1 and a second lower interlayer insulating layer 33L2 on the first lower interlayer insulating layer 33L1. The second lower interlayer insulating layer 33L2 is positioned on the first lower interlayer insulating layer 33L1 and may have a thickness larger than that of each of the interlayer insulating layers under the uppermost interlayer insulating layer 33U.

A gate electrode, among the gate electrodes 72, interposed between the first and second lower interlayer insulating layers 33L1 and 33L2, may be referred to a lower gate electrode 72L1.

A modified vertical structure 40*b* may include a lower semiconductor pattern 39 passing through the first lower interlayer insulating layer 33L1 and the lower gate electrode 72L1 on the lower pattern layer 21 and extending into the second lower interlayer insulating layer 33L2. The vertical structure 40*b* may further include the first dielectric layer 44, the data storage layer 46, the second dielectric layer 48, the channel layer 50, the core region 42 and the pad pattern 54 as previously described, on the lower semiconductor pattern 39.

The lower semiconductor pattern 39 may be, for example, an epitaxial silicon pattern.

In some embodiments, an impurity region 74 having an N-type conductivity may be disposed in the lower pattern layer 21 in or adjacent to a lower portion of the separation structure 75. A region of the lower pattern layer 21 adjacent to the impurity region 74 may have a P-type conductivity. In some embodiments, the region of the lower pattern layer 21 adjacent to the impurity region 74 may have an N-type conductivity having a low impurity concentration than the impurity region 74.

Modified examples of the vertical structure 40 and the stacked structure 30*a*, described in FIG. 3, will be described with reference to FIG. 11.

Figure 11:
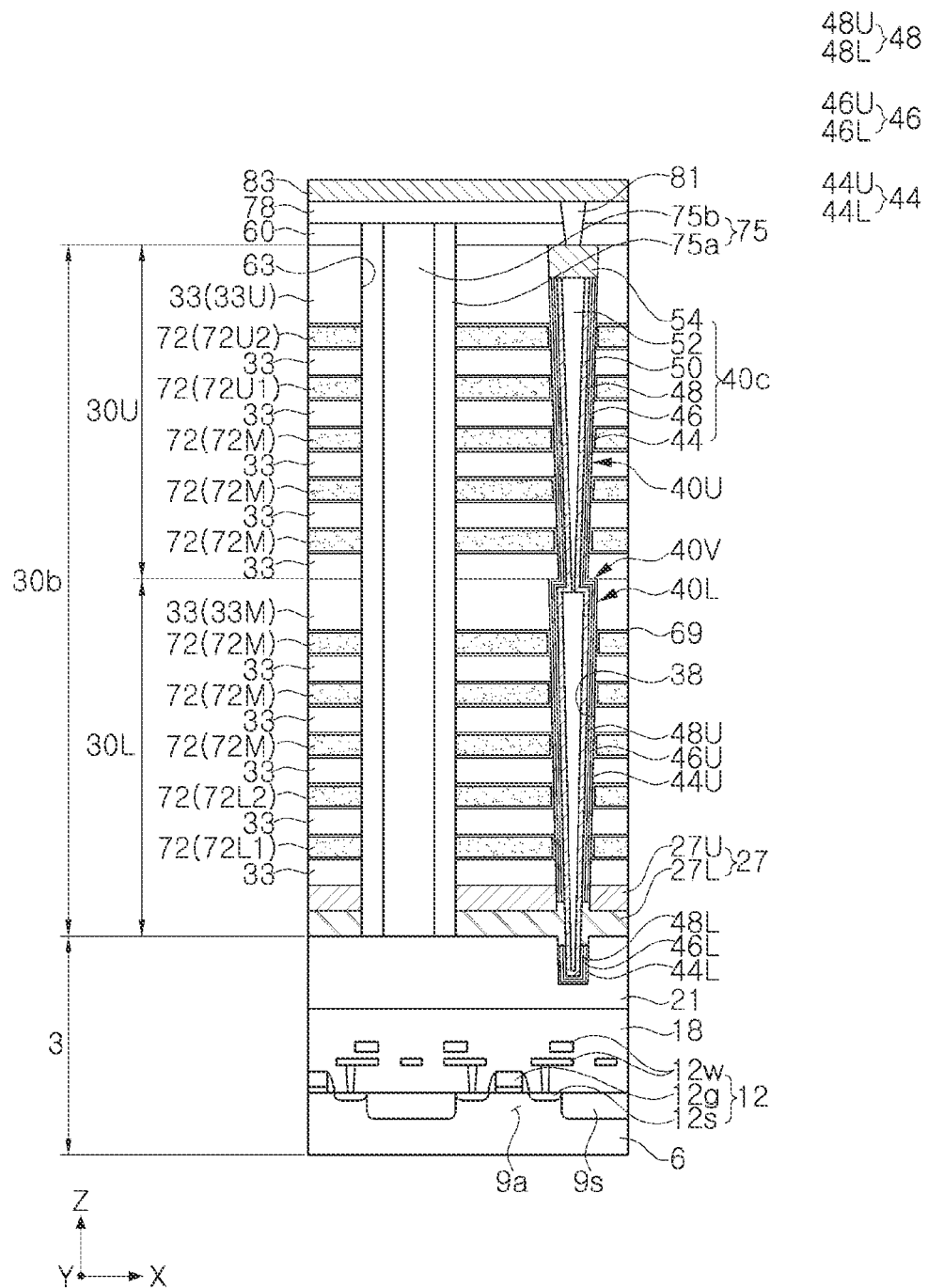
FIG. 11 is a cross-sectional view illustrating a modified example of a semiconductor device according to some embodiments of the present inventive concept.

Referring to FIG. 11, a modified stacked structure 30*b* may include a lower stacked structure 30L and an upper stacked structure 30U on the lower stacked structure 30L. The lower and upper stacked structures 30L and 30U may include gate electrodes 72 and interlayer insulating layers 33 repeatedly and alternately stacked. An interlayer insulating layer 30M, among the interlayer insulating layers 33 of the lower stacked structure 30L, positioned in an upper portion may be thicker than the remaining interlayer insulating layers of the lower stacked structure 30L. An uppermost interlayer insulating layer 33U, among the interlayer insulating layers 33 of the upper stacked structure 30U, positioned in an upper portion may be thicker than the remaining interlayer insulating layers of the upper stacked structure 30U.

The vertical structure 40 described in FIG. 3 may be modified to have a shape of a vertical structure 40*c* in FIG. 11. For example, the vertical structure 40*c* may include a lower vertical portion 40L passing through the lower stacked structure 30L, an upper vertical portion 40U passing through the upper stacked structure 30U, and a width-varying portion 40V, in which a width varies or a a deflected portion is formed, between the lower vertical portion 40L and the upper vertical portion 40U. A width of the upper region of the lower vertical portion 40L may be greater than that of a lower region of the upper vertical portion 40U.

A modified example of the lower structure 3 will then be described with reference to FIG. 12.

Figure 12:
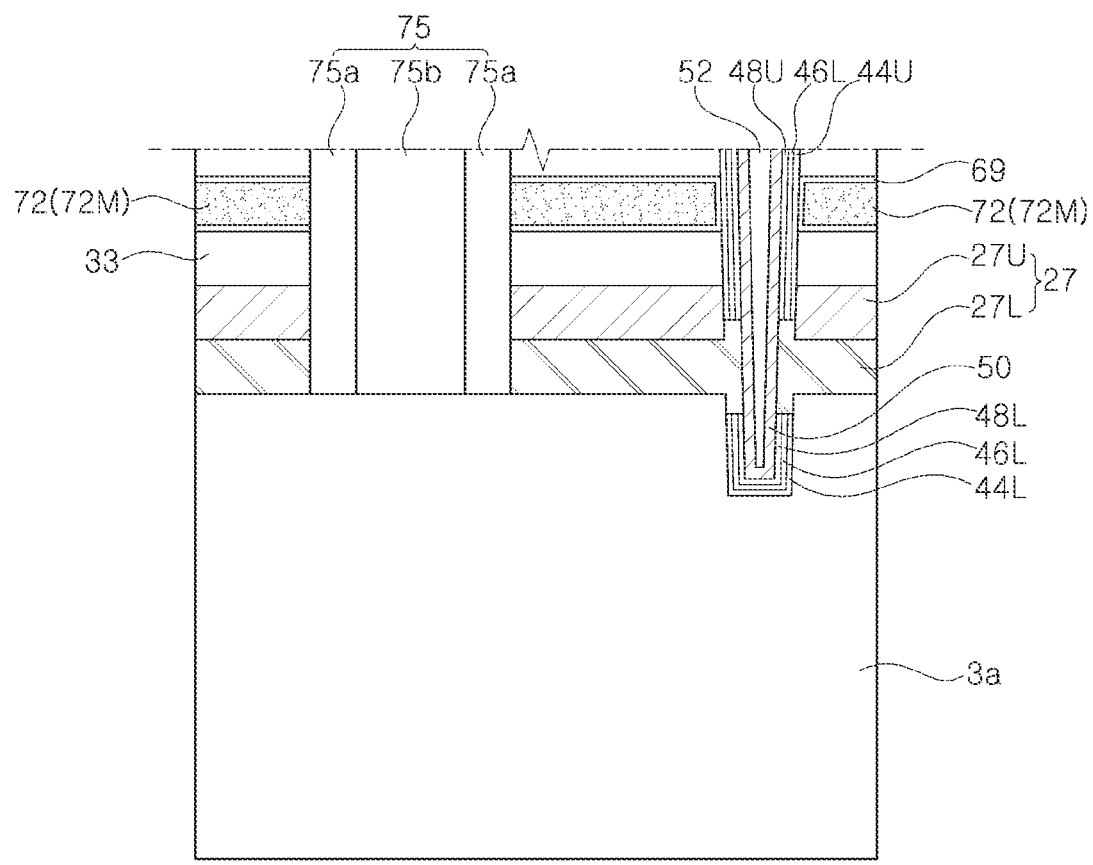
FIG. 12 is a cross-sectional view illustrating a modified example of a semiconductor device according to some embodiments of the present inventive concept.

Referring to FIG. 12, the lower structure 3 of FIG. 11 may be modified to a single crystal semiconductor substrate 3*a*. For example, the vertical structure 40*c* in FIG. 11 may be in contact with the single crystal semiconductor substrate 3*a*. The lower horizontal layer 27L and the separation structure 75 may be in contact with the single crystal semiconductor substrate 3*a*. Such a single crystal semiconductor substrate 3*a* may be replaced with the lower structure 3 illustrated in FIGS. 3, 9 and 10.

Figure 13:
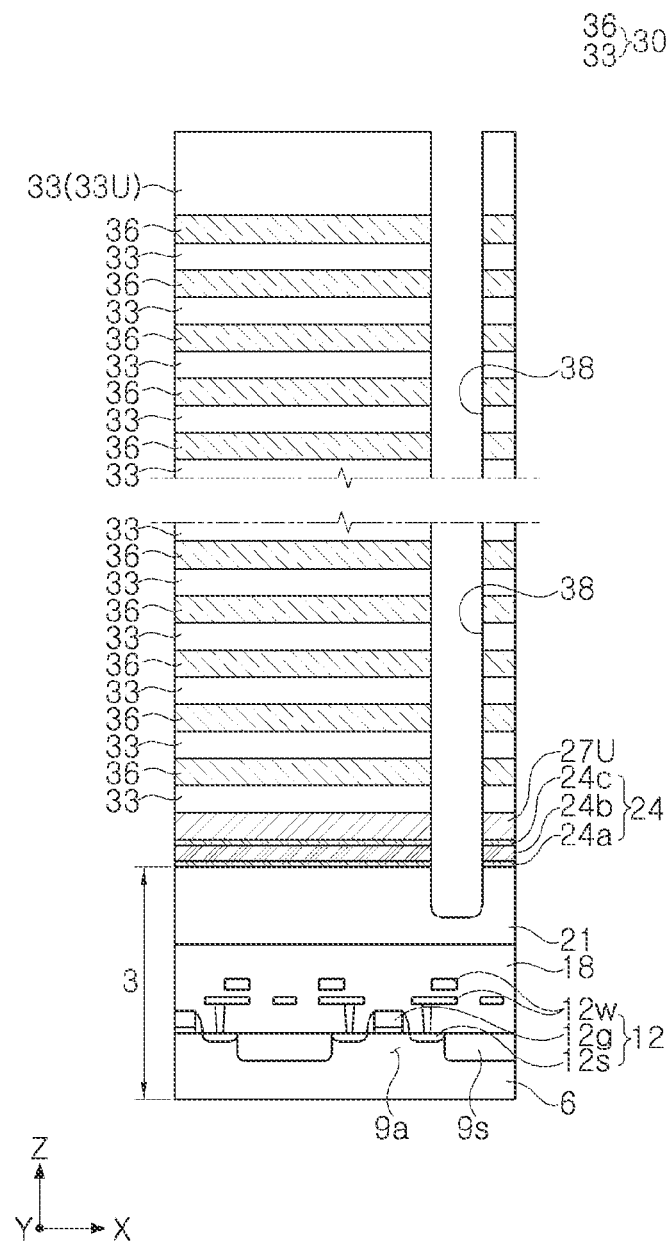
FIGS. 13 to 15 are cross-sectional views illustrating an example of a method for forming a semiconductor device according to some embodiments of the present inventive concept.
Figure 14:
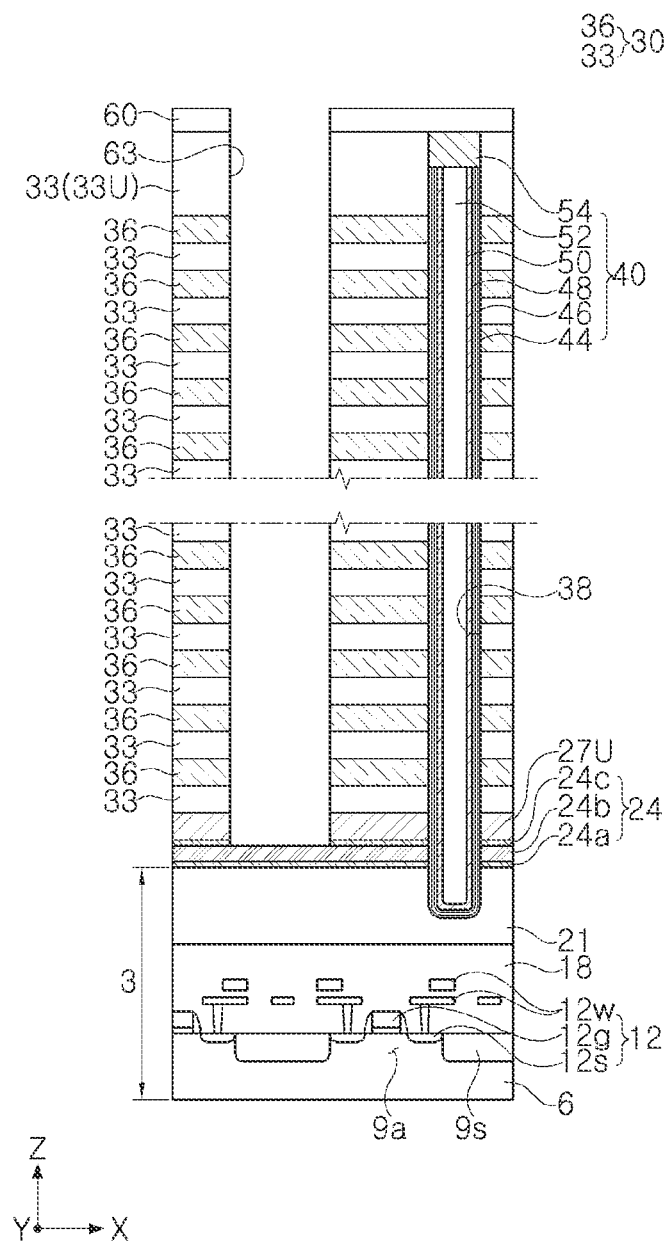
Figure 15:
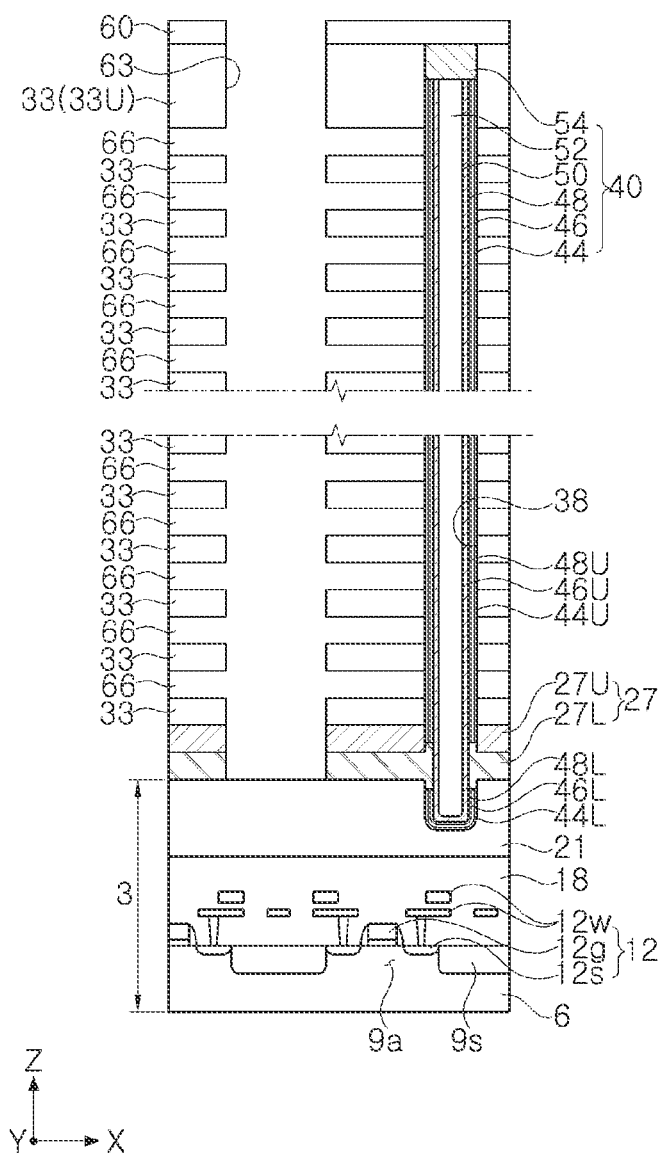

With reference to FIGS. 1 and 13 to 15, methods for forming a semiconductor device according to some embodiments of the present inventive concept will be described. FIGS. 13 to 15 are cross-sectional views illustrating a region taken along line I-I' of FIG. 2.

With reference to FIGS. 1 and 13, a lower structure 3 may be formed. A method for forming the lower structure 3 may include, for example, preparing a semiconductor substrate 6, forming a peripheral circuit 12 and a lower insulating layer 18 on the semiconductor substrate 6 and forming a lower pattern layer 24*a* on the lower insulating layer 18.

The peripheral circuit 12 may include a peripheral gate 12*g* and a peripheral source/drain 12*s*, and a peripheral wiring 12w, as described in FIG. 3. The lower insulating layer 18 may cover the peripheral circuit 12.

In some embodiments, the lower pattern layer 21 may include a conductive material. For example, the lower pattern layer 21 may include a doped polysilicon. The lower pattern layer 21 may be formed of a polysilicon layer in which at least a portion thereof has an N-type conductivity.

A sacrificial layer 24 may be included on the lower pattern layer 21. The sacrificial layer 24 may include a first layer 24a, a second layer 24b and a third layer 24c stacked in order.

In some embodiments, the second layer 24b may be formed of a material having etching selectivity to the first and third layers 24a and 24c. For example, the first and third layers 24a and 24c may be formed of a silicon oxide or a silicon oxide-based insulating material, while the second layer 24b may be formed of a silicon nitride or a silicon nitride-based insulating material.

In some embodiments, the first and third layers 24a and 24c may be formed of an insulating material, and the second layer 24b may be formed of silicon.

A preliminary stacked structure 30 may be formed on the sacrificial layer 24. The preliminary stacked structure 30 may include preliminary horizontal layers 33 and 36 stacked in a vertical direction (Z).

The preliminary stacked structure 30 may be formed by forming horizontal layers 36 and interlayer insulating layers 33 repeatedly and alternately stacked in the vertical direction (Z). The horizontal layers 36 may be spaced apart from each other in the vertical direction Z, and the interlayer insulating layers 33 may be spaced apart from each other in the vertical direction Z.

In some embodiments, an uppermost interlayer insulating layer 33U, among the interlayer insulating layers 33, may be thicker than the remaining interlayer insulating layers.

In some embodiments, the interlayer insulating layers 33 may be formed of a silicon oxide.

In some embodiments, the horizontal layers 36 may be formed of a material different from that of the interlayer insulating layers 33. For example, the horizontal layers 36 may be formed of a silicon nitride. In some embodiments, the horizontal layers 36 may be formed of a conductive material. For example, the horizontal layers 36 may include doped silicon, metal, metal nitride and/or metal-semiconductor compound.

A hole 38 passing through the preliminary stacked structure 30 and the sacrificial layer 24 and extending downwardly to expose the lower pattern layer 21 may be formed.

Referring to FIGS. 2 and 14, the vertical structure 40 may be formed in the hole 38. The vertical structure 40 may be formed by sequentially forming a first dielectric layer 44, a data storage layer 46, a second dielectric layer 48 and a channel layer 50 on an inner wall of the hole 38, forming a core region 52 partially filling the hole 38 on the channel layer 50 and forming a pad pattern 54 filling the remaining portion of the hole 38 on the core region.

In some embodiments, the first dielectric layer 44 may include a silicon oxide or an a silicon oxide doped with an impurity.

In some embodiments, the data storage layer 46 may be formed of a material capable of storing information in a memory device. For example, the data storage layer 46 may be formed of a material capable of storing information by trapping a charge in a flash memory device. For example, the data storage layer 46 may be formed of a silicon nitride. In example embodiments, the silicon nitride of the data storage layer 46 may be replaced with another material capable for storing information.

In some embodiments, the second dielectric layer 48 may include a silicon oxide or an a silicon oxide doped with an impurity. For example, the second dielectric layer 48 may include a silicon oxide or an a silicon oxide doped with nitrogen.

In some embodiments, the channel layer 50 may be formed of a silicon layer, for example, a polysilicon layer. For example, the channel layer 50 may be formed of an undoped polysilicon layer.

In some embodiments, the core region 52 may be formed of a silicon oxide or a silicon oxide including a void therein.

In some embodiments, the pad pattern 54 may include a conductive material. The pad pattern 54 may include, for example, polysilicon having an N-type conductivity.

A first upper insulating layer 60 may be formed on the preliminary stacked structure 30 and the vertical structure 40.

A separation trench 63 passing through the first upper insulating layer 60 and the preliminary stacked structure 30 and exposing the second layer 24b of the sacrificial layer 24 may be formed.

Referring to FIGS. 2 and 15, a lower horizontal layer 27L may be formed by replacing the sacrificial layer 24, and the lower horizontal layer 27L may be in contact with a portion of the channel layer 50 that was adjacent to the sacrificial layer 24 before replacing the sacrificial layer 24 with the lower horizontal layer 27L.

In some embodiments, the lower horizontal layer 27L may be formed by forming a sacrificial spacer on a sidewall of the separation trench 63 to protect a side surface of the preliminary stacked structure (30 of FIG. 13), removing the sacrificial layer 24 exposed by the separation trench 63 to expose the first dielectric layer 44 of the vertical structure 40, etching the first dielectric layer 44, the data storage layer 46 and the second dielectric layer 48 to expose the channel layer 50, forming a conductive material in a space in which the sacrificial layer 24 is removed and a region in which the first dielectric layer 44, the data storage layer 46 and the second dielectric layer 48 are etched, and removing the sacrificial spacer to expose the side surface of the preliminary stacked structure (30 of FIG. 13).

In some embodiments, the lower horizontal layer 27L may be formed of a doped silicon layer. For example, the lower horizontal layer 27L may be formed of a silicon layer having an N-type conductivity.

In some embodiments, the channel layer 50 adjacent to the lower horizontal layer 27L may include an impurity diffused from the lower horizontal layer 27L. For example, the channel layer 50 adjacent to the lower horizontal layer 27L may have an N-type conductivity.

In some embodiments, the lower and upper horizontal layers 27L and 27U may be collectively referred to as a horizontal connection layer 27.

After the lower horizontal layer 27L is formed, the horizontal layers 36 exposed by the separation trench 63 are etched to form openings 66 exposing the first dielectric layer 44 of the vertical structure 40.

Referring to FIGS. 2 and 3 again, the anti-ferroelectric layer 69 and the gate electrode 72 may be formed in each of the openings 66. The anti-ferroelectric layer 69 may cover upper and lower surfaces of the gate electrode 72 and may be disposed between the gate electrode 72 and the first dielectric layer 44 of the vertical structure 40.

In some embodiments, the anti-ferroelectric layer 69 formed in the openings 66 may be formed of a material having a tetragonal phase.

In some embodiments, the anti-ferroelectric layer 69 formed in the openings 66 may be formed of a material having a dynamic dielectric constant.

The gate electrodes 72 may be formed of one or more of conductive materials. For example, the gate electrodes 72 may include doped silicon, metal nitride (e.g, TiN), metal (e.g., W), and/or metal-semiconductor compound (e.g., TiSi or WSi).

A separation structure 75 filling the separation trench 63 may be formed.

In some embodiments, the separations structure 75 may include a separation core pattern 75b and a separation spacer 75a on a side surface of the separation core pattern 75b.

A second upper insulating layer 78 may be formed on the separation structure 75 and the first upper insulating layer 60.

A contact plug 81 passing through the first and second upper insulating layers 60 and 78 and electrically connected to the pad pattern 54 of the vertical structure 40 may be formed. A bit line 83 may be formed on the contact plug 81.

According to the example embodiments, an anti-ferroelectric material adjacent to or in contact with word lines can be provided between the word lines and a channel layer. Memory cell transistors including such an anti-ferroelectric material may have improved programming operation and erasing operation characteristics. Accordingly, performance of a semiconductor device may be improved. Further, a data retention characteristic of the memory cell transistors including an anti-ferroelectric material may be improved.

Various advantages and beneficial effects of the present inventive concept are not limited to the foregoing descriptions of the embodiments of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor device comprising:
   a stacked structure including interlayer insulating layers and gate electrodes alternately stacked in a vertical direction;
   a core region extending in the vertical direction in the stacked structure;
   a channel layer on a side surface of the core region and facing the gate electrodes and the interlayer insulating layers;
   a second dielectric layer, a data storage layer and a first dielectric layer sequentially stacked on the side surface of the channel layer, the second dielectric layer, the data storage layer and the first dielectric layer being between the channel layer and the gate electrodes, and the second dielectric layer being in contact with the channel layer; and
   an anti-ferroelectric layer including a portion interposed between the first dielectric layer and a first gate electrode of the gate electrodes,
   wherein the anti-ferroelectric layer has a dynamic dielectric constant and comprises an anti-ferroelectric material having a tetragonal phase, and
   each of the first and second dielectric layers includes an oxide layer having a dielectric constant lower than a lowest dielectric constant of the anti-ferroelectric layer.

2. The semiconductor device of claim 1, wherein the anti-ferroelectric material includes a hafnium (Hf)-based oxide or a zirconium (Zr)-based oxide.

3. The semiconductor device of claim 1, wherein the anti-ferroelectric material includes a Hf-based oxide doped with an impurity.

4. The semiconductor device of claim 3, wherein the impurity includes Zr, Al, Si and/or La.

5. The semiconductor device of claim 1, wherein the anti-ferroelectric layer contacts the first dielectric layer and the first gate electrode.

6. The semiconductor device of claim 1, wherein the anti-ferroelectric material includes a Zr-based oxide doped with an impurity.

7. The semiconductor device of claim 6, wherein the impurity includes Hf, Al, Si and/or La.

8. The semiconductor device of claim 1, wherein
   the channel layer includes an undoped silicon layer, and
   the core region includes a silicon oxide layer or a silicon oxide layer including a void.

9. The semiconductor device of claim 1, wherein the anti-ferroelectric layer further includes portions respectively extending on an upper surface and a lower surface of the first gate electrode of the gate electrodes.

10. The semiconductor device of claim 1, wherein the anti-ferroelectric layer further includes portions interposed between the first dielectric layer and the interlayer insulating layers.

11. A semiconductor device comprising:
    a stacked structure including interlayer insulating layers and gate electrodes alternately stacked in a vertical direction;
    a core region extending in the vertical direction in the stacked structure;
    a channel layer on a side surface of the core region and facing the gate electrodes and the interlayer insulating layers;
    a second dielectric layer, a data storage layer and a first dielectric layer sequentially stacked on the side surface of the channel layer, the second dielectric layer, the data storage layer and the first dielectric layer being between the channel layer and the gate electrodes, and the second dielectric layer being in contact with the channel layer; and
    an anti-ferroelectric layer including a portion between the first dielectric layer and a first gate electrode of the gate electrodes,
    wherein the anti-ferroelectric layer comprises an anti-ferroelectric material having a tetragonal phase,
    the first gate electrode of the gate electrodes is a portion of a word line of a memory cell,
    the anti-ferroelectric material of the anti-ferroelectric layer has a dynamic dielectric constant that varies corresponding to a magnitude of an electric field between the word line and the channel layer,
    the first dielectric layer comprises a first dielectric material, and the second dielectric layer comprises a second dielectric material, and
    the data storage layer comprises a third dielectric material that is different from the first and second dielectric materials.

12. The semiconductor device of claim 11, wherein the anti-ferroelectric material is configured to have a first dielectric constant when the magnitude of the electric field between the word line and the channel layer is zero and is configured to have a second dielectric constant during a programming operation of the memory cell, and the second dielectric constant is greater than the first dielectric constant.

13. The semiconductor device of claim 11, wherein the anti-ferroelectric material is configured to have a first dielectric constant when the magnitude of the electric field between the word line and the channel layer is zero and is configured to have a second dielectric constant during an erasing operation of the memory cell, and the second dielectric constant is greater than the first dielectric constant.

14. The semiconductor device of claim 11, wherein the anti-ferroelectric material comprises a Hf-based oxide or a Zr-based oxide.

15. A semiconductor device comprising:
    a stacked structure including interlayer insulating layers and gate electrodes alternately stacked in a vertical direction;
    a core region extending in the vertical direction the stacked structure;
    a channel layer on a side surface of the core region and facing the gate electrodes and the interlayer insulating layers;
    a second dielectric layer, a data storage layer and a first dielectric layer sequentially stacked on the side surface of the channel layer, the second dielectric layer, the data storage layer and the first dielectric layer being between the channel layer and the gate electrodes, and the second dielectric layer being in contact with the channel layer;
    an anti-ferroelectric layer including a portion between the first dielectric layer and a first gate electrode of the gate electrodes,
    a pad pattern in contact with the channel layer on the core region;
    a contact plug in contact with the pad pattern on the pad pattern; and
    a bit line electrically connected to the contact plug on the contact plug,
    wherein the anti-ferroelectric layer comprises an anti-ferroelectric material having a tetragonal phase,
    the first gate electrode of the gate electrodes is a portion of a word line,
    the anti-ferroelectric material of the anti-ferroelectric layer has a dynamic dielectric constant that varies corresponding to a magnitude of an electric field between the word line and the channel layer,
    the first dielectric layer comprises a first silicon oxide layer having a first dielectric constant, and the second dielectric layer comprises a second silicon oxide layer having a second dielectric constant, and
    the first dielectric constant and the second dielectric constant are lower than a lowest dielectric constant of the anti-ferroelectric layer.

16. The semiconductor device of claim 15, wherein the anti-ferroelectric material includes a Hf-based oxide or a Zr-based oxide.

17. The semiconductor device of claim 15, wherein the pad pattern comprises silicon having an N-type conductivity, and
    the channel layer facing the word line comprises undoped silicon.

18. The semiconductor device of claim 16 further comprising a lower structure, wherein the lower structure includes:
    a semiconductor substrate;
    a peripheral circuit on the semiconductor substrate;
    a lower insulating layer extending on the peripheral circuit on the semiconductor substrate; and
    a lower pattern layer on the lower insulating layer,
    wherein the lower pattern layer includes a doped silicon layer.

19. The semiconductor device of claim 18, further comprising a horizontal connection layer on the lower pattern layer,
    wherein the horizontal connection layer includes a lower connection layer and an upper connection layer on the lower connection layer,
    the lower connection layer is in contact with the lower pattern layer,
    the upper connection layer is in contact with the lower connection layer,
    the core region and the channel layer pass through the horizontal connection layer and protrude into the lower pattern layer,
    the lower connection layer is in contact with the channel layer, and
    the upper connection layer is spaced apart from the channel layer.

20. The semiconductor device of claim 15, wherein the data storage layer comprises a dielectric material that is different from the first and second silicon oxide layers.

* * * * *